(12) United States Patent
Ma et al.

(10) Patent No.: US 10,819,400 B2
(45) Date of Patent: Oct. 27, 2020

(54) ANODE MATERIALS FOR LITHIUM ION BATTERIES AND METHODS OF MAKING AND USING SAME

(71) Applicant: JOHNSON MATTHEY PUBLIC LIMITED COMPANY, London (GB)

(72) Inventors: Xiaohua Ma, Woodbury, MN (US); Vincent J. Chevrier, St. Paul, MN (US)

(73) Assignee: Johnson Matthey Public Limited Company, London (GB)

( * ) Notice: Subject to any disclaimer, the term of this patent is extended or adjusted under 35 U.S.C. 154(b) by 104 days.

(21) Appl. No.: 15/559,083

(22) PCT Filed: Mar. 17, 2016

(86) PCT No.: PCT/US2016/022754
§ 371 (c)(1),
(2) Date: Sep. 18, 2017

(87) PCT Pub. No.: WO2016/149442
PCT Pub. Date: Sep. 22, 2016

(65) Prior Publication Data
US 2018/0076445 A1    Mar. 15, 2018

Related U.S. Application Data

(60) Provisional application No. 62/135,296, filed on Mar. 19, 2015.

(51) Int. Cl.
*H01M 4/131* (2010.01)
*H04B 7/0413* (2017.01)
(Continued)

(52) U.S. Cl.
CPC .......... *H04B 7/0413* (2013.01); *C01B 25/45* (2013.01); *G01R 23/173* (2013.01); *H01M 4/131* (2013.01);
(Continued)

(58) Field of Classification Search
CPC ...... H01M 4/131; H01M 10/052; H01M 4/58; H01M 4/62; H01M 4/64; H01M 4/362;
(Continued)

(56) References Cited

U.S. PATENT DOCUMENTS 5,965,293 A    10/1999    Idota
6,680,145 B2    1/2004    Obrovac
(Continued)

FOREIGN PATENT DOCUMENTS

| EP | 2596883 |   | 5/2013 |
|----|---------|---|--------|
| EP | 2596883 | * | 5/2015 |
| JP | 2013-171812 |   | 9/2013 |

OTHER PUBLICATIONS

Naranyan, Rev. Adv. Mater. Sci., 2005, 130-177 (Year: 2005).*
(Continued)

*Primary Examiner* — Alexander Usyatinsky
(74) *Attorney, Agent, or Firm* — BakerHostetler (57) ABSTRACT

An electrochemically active material is represented by general formula (I): $Si_u Sn_v M_{1w} M_{2x}[P_{0.2}O_{0.8}]_y \cdot A_z$ (I) where u, v, w, x, y, and z represent atomic % values and u+v+w+x+y+z=100, $M_1$ includes a metal element or combinations of metal elements selected from Ti, V, Cr, Mn, Fe, Co, Ni, Cu, Zr, B, carbon, or alloys thereof, $M_2$ includes a metal element or combinations of metal elements selected from Mg, Al, Ti, V, Cr, Mn, Fe, Co, Ni, Cu, Zn, Zr, or alloys thereof, A is an inactive phase other than a phosphate or silicide, and $0<u<90$, $0\leq v<20$, $0<w<50$, $0<x<20$, $0<y<20$, and $0\leq z<50$.

15 Claims, 1 Drawing Sheet (51) Int. Cl.

| | | |
|---|---|---|
| C01B 25/45 | (2006.01) | |
| H01M 4/134 | (2010.01) | |
| H01M 4/36 | (2006.01) | |
| H01M 4/38 | (2006.01) | |
| G01R 23/173 | (2006.01) | |
| H04J 14/02 | (2006.01) | |
| H01M 4/62 | (2006.01) | |
| H01M 4/64 | (2006.01) | |
| H01M 4/58 | (2010.01) | |
| H01M 10/052 | (2010.01) | |
| H01M 4/136 | (2010.01) | |
| H01M 4/02 | (2006.01) | |
| H04L 1/00 | (2006.01) | |
| H04L 27/26 | (2006.01) | |

(52) U.S. Cl.
CPC .......... *H01M 4/134* (2013.01); *H01M 4/362* (2013.01); *H01M 4/386* (2013.01); *H01M 4/621* (2013.01); *H01M 4/64* (2013.01); *H04J 14/0247* (2013.01); *H04J 14/0282* (2013.01); *H01M 4/136* (2013.01); *H01M 4/387* (2013.01); *H01M 4/5825* (2013.01); *H01M 10/052* (2013.01); *H01M 2004/027* (2013.01); *H01M 2004/028* (2013.01); *H04J 2014/0253* (2013.01); *H04L 1/0045* (2013.01); *H04L 27/2675* (2013.01)

(58) Field of Classification Search
CPC ...... H01M 4/134; H01M 4/386; H01M 4/621; H01M 2004/028; H01M 4/5825; H01M 2004/027; H01M 4/136; H01M 4/387; C01B 25/45; G01R 23/173; H04B 7/0413; H04J 14/0247; H04J 14/0282; H04J 2014/0253; H04L 1/0045; H04L 27/2675
See application file for complete search history.

(56) References Cited

U.S. PATENT DOCUMENTS

| | | | |
|---|---|---|---|
| 8,062,561 B2 * | 11/2011 | Jumas ................ | H01M 4/134 252/519.54 |
| 8,753,545 B2 * | 6/2014 | Obrovac .............. | H01M 4/38 252/500 |
| 9,653,752 B2 * | 5/2017 | Ihara ................ | H01M 10/0565 |
| 2006/0292444 A1 * | 12/2006 | Chiang .............. | H01M 4/134 429/218.1 |
| 2007/0048612 A1 | 3/2007 | Nakajima | |
| 2008/0206641 A1 | 8/2008 | Christensen | |
| 2009/0136846 A1 * | 5/2009 | Lee .................. | H01M 2/1653 429/217 |
| 2010/0270497 A1 * | 10/2010 | Hezeque ............ | C22C 1/0483 252/182.1 |
| 2011/0215280 A1 | 9/2011 | Obrovac | |
| 2011/0291041 A1 * | 12/2011 | Liu .................. | C01B 25/45 252/182.1 |
| 2013/0234074 A1 * | 9/2013 | Gilles ............... | B22F 1/0011 252/504 |
| 2014/0127581 A1 * | 5/2014 | Chen ................ | H01M 4/364 429/221 |
| 2014/0199594 A1 | 7/2014 | Hong | |
| 2015/0021516 A1 | 1/2015 | Kwon | |

OTHER PUBLICATIONS

Kumar, "Space-Charge-Mediated Superionic Transport in Lithium Ion Conducting Glass-Ceramics", Journal of the Electrochemical Society, 2009, vol. 156, No. 7, pp. A506-A513.

Narayanan, "Surface Pretreatment by Phosphate Conversion Coatings—A Review", Reviews on Advanced Materials Science, 2005, vol. 9, pp. 130-177.

Thokchom, "Superionic Conductivity in a Lithium Aluminum Germanium Phosphate Glass-Ceramic", Journal of the Electrochemical Society, 2008, vol. 155, No. 12, pp. A915-A920.

Extended EP Search Report for EP 16765708, dated Jul. 7, 2018.

International Search Report for PCT International Application No. PCT/US2016/22754, dated Jun. 10, 2016, 2pgs.

* cited by examiner

ANODE MATERIALS FOR LITHIUM ION BATTERIES AND METHODS OF MAKING AND USING SAME

CROSS REFERENCE TO RELATED APPLICATIONS

This application is a national stage filing under 35 U.S.C. 371 of PCT/US2016/022754, filed Mar. 17, 2016, which claims the benefit of U.S. Provisional Application No. 62/135,296, filed Mar. 19, 2015, the disclosure of which is incorporated by reference in its/their entirety herein.

FIELD

The present disclosure relates to compositions useful in anodes for lithium ion batteries and methods for preparing and using the same.

BACKGROUND

Various anode compositions have been introduced for use in lithium-ion batteries. Such compositions are described, for example, in U.S. Pat. Nos. 8,753,545 and 5,965,293.

SUMMARY

In some embodiments, an electrochemically active material is provided. The electrochemically active material is represented by general formula (I):

$$Si_u Sn_v M_{1w} M_{2x} [P_{0.2} O_{0.8}]_y \cdot A_z \qquad (I)$$

where u, v, w, x, y, and z represent atomic % values and u+v+w+x+y+z=100, $M_1$ includes a metal element or combinations of metal elements selected from Ti, V, Cr, Mn, Fe, Co, Ni, Cu, Zr, B, carbon, or alloys thereof, $M_2$ includes a metal element or combinations of metal elements selected from Mg, Al, Ti, V, Cr, Mn, Fe, Co, Ni, Cu, Zn, Zr, or alloys thereof, A is an inactive phase other than a phosphate or silicide, and 0<u<90, 0≤v<20, 0<w<50, 0<x<20, 0<y<20, and 0≤z<50.

In some embodiments, an electrode composition is provided. The electrode composition includes the above-described electrochemically active material and a binder.

In some embodiments, a negative electrode is provided. The negative electrode includes a current collector and the above-described electrode composition.

In some embodiments, an electrochemical cell is provided. The electrochemical cell includes the above-described negative electrode, a positive electrode comprising a positive electrode composition comprising lithium, and an electrolyte comprising lithium.

In some embodiments, a method of making an electrochemical cell is provided. The method includes providing a positive electrode comprising a positive electrode composition comprising lithium, providing a negative electrode as described above, providing an electrolyte comprising lithium, and incorporating the positive electrode, negative electrode, and the electrolyte into an electrochemical cell.

The above summary of the present disclosure is not intended to describe each embodiment of the present disclosure. The details of one or more embodiments of the disclosure are also set forth in the description below. Other features, objects, and advantages of the disclosure will be apparent from the description and from the claims.

BRIEF DESCRIPTION OF THE DRAWINGS

The disclosure may be more completely understood in consideration of the following detailed description of various embodiments of the disclosure in connection with the accompanying figures, in which.

DETAILED DESCRIPTION

Silicon (Si) based alloys are a promising alternative to graphite as anode materials for next generation high energy density lithium ion batteries due, at least in part, to their higher energy density. However, relative to graphite, Si-based alloys are known to exhibit higher irreversible capacity and lower rate capabilities.

Generally, it is understood that amorphous or nanocrystalline alloy anode materials exhibit superior cycling performance than crystalline alloy anode materials. A class of promising amorphous or nanocrystalline alloy anode materials has been described as having both an active phase and an inactive phase. Such materials, in addition to providing an amorphous or nanocrystalline microstructure, have enabled anode materials having lower surface area and reduced volume expansion during cycling relative to pure nano-silicon. However, heretofore, inactive phases of these materials have contributed to electrical conductivity only (as opposed to electrical and ionic conductivity). As lithium ions and electrons are required to transport into and out of the alloy anode during cycling, it is believed that active/inactive alloy anodes could be further improved by employing an inactive phase that aids in the ionic conductivity of the anode material, and that also contributes to the stability of the amorphous or nanocrystalline microstructure. Generally, it was discovered that incorporation of certain phosphates into alloy anode materials contributed to both ionic conductivity and microstructure stability and, in turn, resulted in alloy anodes having improved (lower) irreversible capacities as well as improved microstructure stability.

As used herein, the terms "lithiate" and "lithiation" refer to a process for adding lithium to an electrode material or electrochemically active phase;

the terms "delithiate" and "delithiation" refer to a process for removing lithium from an electrode material or electrochemically active phase;

the terms "charge" and "charging" refer to a process for providing electrochemical energy to a cell;

the terms "discharge" and "discharging" refer to a process for removing electrochemical energy from a cell, e.g., when using the cell to perform desired work;

the phrase "charge/discharge cycle" refers to a cycle wherein an electrochemical cell is fully charged, i.e. the cell attains it's upper cutoff voltage and the cathode is at about 100% state of charge, and is subsequently discharged to attain a lower cutoff voltage and the cathode is at about 100% depth of discharge;

the phrase "positive electrode" refers to an electrode (often called a cathode) where electrochemical reduction and lithiation occurs during a discharging process in a full cell the phrase "negative electrode" refers to an electrode (often called an anode) where electrochemical oxidation and delithiation occurs during a discharging process in a full cell;

the term "alloy" refers to a substance that includes any or all of metals, metalloids, or semimetals;

the phrase "electrochemically active material" refers to a material, which can include a single phase or a plurality of phases, that can electrochemically react or alloy with lithium under conditions possibly encountered during charging and discharging in a lithium ion battery (e.g., voltages between 0 V and 2 V versus lithium metal);

the phrase "electrochemically inactive material" refers to a material, which can include a single phase or a plurality of phases, that does not electrochemically react or alloy with lithium under conditions possibly encountered during charging and discharging in a lithium ion battery (e.g., voltages between 0 V and 2 V versus lithium metal);

the phrases "electrochemically active phase" or "active phase" refer to a phase of an electrochemically active material that can electrochemically react or alloy with lithium under conditions possibly encountered during charging and discharging in a lithium ion battery (e.g., voltages between 0 V and 2 V versus lithium metal);

the phrases "electrochemically inactive phase" or "inactive phase" refer to phases of an electrochemically active material that does not electrochemically react or alloy with lithium under conditions possibly encountered during charging and discharging in a lithium ion battery (e.g., voltages between 0 V and 2 V versus lithium metal);

the phrases "electrochemically active chemical element" or "active chemical element" refer to chemical elements that can electrochemically react or alloy with lithium under conditions possibly encountered during charging and discharging in a lithium ion battery (e.g., voltages between 0 V and 2 V versus lithium metal);

the phrase "conducting phase" refers to a phase that has substantially high electrical conductivity, including metal conductors, semi-metals, and semiconductors, but is not substantially electrochemically active.

the phrase "insulating phase" refers to a phase that does not substantially conduct electricity and is not substantially electrochemically active, but may or may not be ionically conductive;

the phrase "substantially homogeneous" refers to a material in which the components or domains of the material are sufficiently mixed with one another such that the make-up of one portion of the material is the same as that of any other portion of the material on a length scale of 100 nanometers or more;

As used herein, the singular forms "a", "an", and "the" include plural referents unless the content clearly dictates otherwise. As used in this specification and the appended embodiments, the term "or" is generally employed in its sense including "and/or" unless the content clearly dictates otherwise.

As used herein, the recitation of numerical ranges by endpoints includes all numbers subsumed within that range (e.g. 1 to 5 includes 1, 1.5, 2, 2.75, 3, 3.8, 4, and 5).

Unless otherwise indicated, all numbers expressing quantities or ingredients, measurement of properties and so forth used in the specification and embodiments are to be understood as being modified in all instances by the term "about." Accordingly, unless indicated to the contrary, the numerical parameters set forth in the foregoing specification and attached listing of embodiments can vary depending upon the desired properties sought to be obtained by those skilled in the art utilizing the teachings of the present disclosure. At the very least, and not as an attempt to limit the application of the doctrine of equivalents to the scope of the claimed embodiments, each numerical parameter should at least be construed in light of the number of reported significant digits and by applying ordinary rounding techniques.

In some embodiments, the present disclosure relates to an electrochemically active material for use in an electrochemical cell (e.g., a lithium ion battery). For example, the electrochemically active material may be incorporated into a negative electrode for a lithium ion battery.

In some embodiments, the electrochemically active material may be represented by the following general formula (I):

$$Si_u Sn_v M_{1w} M_{2x} [P_{0.2} O_{0.8}]_y A_z \qquad (I)$$

where u, v, w, x, y, and z represent atomic % values and u+v+w+x+y+z=100, $M_1$ comprises a metal element or combinations of metal elements selected from Ti, V, Cr, Mn, Fe, Co, Ni, Cu, Zr, B, C, or alloys thereof; $M_2$ comprises a metal element or combinations of metal elements selected from Mg, Al, Ti, V, Cr, Mn, Fe, Co, Ni, Cu, Zn, Zr, or alloys thereof; A is an inactive phase that does not include phosphates or silicides, such as those inactive phases that include conductive phases such as $TiB_2$, TiN, $FeAl_3$, and $TiAl_3$, or insulating phases such as $Al_2O_3$, MgO, $MgAl_2O_4$, $LiAlO_2$, $Li_2CO_3$, $SiO_2$, $B_2O_3$, and LiF; 0<u<90, 30<u<80, or 50<u<80; 0≤v<20, 0≤v<10, or 0≤v<5; 0<w<50, 0<w<30, or 0<w<20; 0<x<20, 0<x<10, or 0<x<5; 0<y<20, 0<y<10, or 0<y<5; 0≤z<50, 0≤z<30, or 0≤z<20. In some embodiments, $M_1$ includes Fe and, additionally or alternatively, $M_2$ includes Mg or Al.

In some embodiments, the electrochemically active material represented by the general formula (I) may include one or more active phases. The active phase may be in the form of or include an active chemical element, an active alloy, or combinations thereof. The active phase may include one or more active chemical elements such as but not limited to Mg, Ca, Sr, Ag, Zn, B, Al, Si, Sn, Pb, Sb, Bi, or combinations thereof. In some embodiments, the active phase may include Si. In some embodiments, the active phase may include Si and Sn. In some embodiments, the active phase may consist essentially of Si. In some embodiments, the active phase may further include one or more inactive chemical elements, such as Ti, V, Cr, Mn, Fe, Co, Ni, Cu, or Zn.

In some embodiments, active phase may account for at least 30 vol. % or at least 40 vol. % of the active material based on the total volume of the active material; or between 30 vol. % and 70 vol. %, between 40 vol. % and 60 vol. %, between 40 vol. % and 55 vol. % between 40 vol. % and 42 vol. %, or between 50 vol. % and 52 vol. %, based on the total volume of the active material.

In some embodiments the electrochemically active material may further include an electrochemically inactive phase, such that the electrochemically active phase and the electrochemically inactive phase share at least one common phase boundary. In various embodiments, the electrochemically inactive phase may be in the form of or include one or more electrochemically inactive chemical elements, including transition metals (e.g., titanium, vanadium, chromium, manganese, iron, cobalt, nickel), alkaline earth metals, rare earth metals, or combinations thereof. In various embodiments, the electrochemically inactive phase may be in the form of an alloy. In various embodiments, the electrochemically inactive phase may include a transition metal or combination of transition metals. In some embodiments, the electrochemically inactive phase may include one or more active chemical elements, including tin, carbon, gallium, indium, silicon, germanium, lead, antimony, bismuth, or combinations thereof. In some embodiments, the electrochemically inactive phase may include compounds such as silicides, aluminides, borides, carbides, nitrides, phosphates or stannides. The electrochemically inactive phase may include oxides, such as titanium oxide, zinc oxide, silicon oxide, aluminum oxide or sodium-aluminum oxide.

In some embodiments, inactive phase may account for between 30 vol. % and 70 vol. %, between 40 vol. % and 60 vol. %, or between 40 vol. % and 55 vol. % of the active material, based on the total volume of the active material.

In some embodiments, the inactive phase may include one or more conducting phases. The conducting phase may include one or more metal elements, an alloy, a carbide, an aluminide, a silicide, a boride, a nitride, or a combination thereof. Exemplary conducting phases include Ti, V, Cr, Mn, Fe, Co, Ni, Cu, and their alloys. In some embodiments, one or more conducting phases may include silicon. Exemplary carbide conducting phases include TiC and SiC. Exemplary silicide conducting phases include FeSi, $FeSi_2$, $CrSi_2$, $NiSi_2$, $CoSi_2$, $TiSi_2$, $Cu_3Si$, $ZrSi_2$, and their ternary and higher order intermetallic compounds. Other exemplary conducting phases include $TiB_2$, TiN, $FeAl_3$, and $TiAl_3$. The conducting phase can be stoichiometric or nonstoichiometric. In some embodiments, the conducting phase may account for between 1 vol. % and 60 vol. %, between 10 vol. % and 50 vol. %, or between 30 vol. % and 50 vol. % of the active material, based on the total volume of the active material.

In some embodiments, in addition to or as an alternative to one or more conductive phases, the inactive phase may include one or more insulating phases. In some embodiments, the insulating phase may include a ceramic material (i.e., an inorganic, typically non-metallic, solid that can be prepared by the action of heat and subsequent cooling of constituent materials). In some embodiments, the insulating phase may include a borate, a carbonate, an oxide, a sulphate, a silicate, a halide and combinations thereof. Insulating phases that are useful in the provided active materials include oxides of Li, Na, Mg, Ca, La, Ce, Ti, Zr, K, Al, Si, B, and combinations thereof. In some embodiments, the provided active material includes an insulating phase that is selected from $Al_2O_3$, $MgAl_2O_3$, $LiAlO_2$, $Li_2CO_3$, $SiO_2$, $B_2O_3$, LiF, and combinations thereof. The insulating phase can be stoichiometric or can be non-stoichiometric. By stoichiometric it is meant that the atomic ratios of the components of the phase can be represented by ratios of integers. Typically these components are solids and contain crystalline domains or grains. By non-stoichiometric it is meant that the atomic ratios of the components of the phase cannot be represented by a ratio of integers. In some embodiments, the insulating phase may account for between 0.1 vol. % and 30 vol. %, between 1 vol. % and 20 vol. %, or between 3 vol. % and 15 vol. % of the active material, based on the total volume of the active material.

In some embodiments, in addition to or as an alternative to other insulating phases, the insulating phase may include one or more phosphates of the formula $M_{2x}[P_{0.2}O_{0.8}]_y$, where the O:P ratio of 4:1 is indicative of a phosphate anion. As discussed above, $M_2$ may include a metal element or combination of metal elements selected from Mg, Al, Ti, V, Cr, Mn, Fe, Co, Ni, Cu, Zn, Zr. In some embodiments, the phosphate of the formula $M_{2x}[P_{0.2}O_{0.8}]_y$ may be a water stable phosphate. As used herein, a water stable phosphate refers to a phosphate of an active material, which, upon introduction of the active material into water and subsequent drying of the active material, can be identified by annealing the dried material under argon gas flow at a high temperature such as 1000° C. and taking an X-ray diffraction (XRD) pattern of the annealed material.

In some embodiments, the phosphates of the formula $M_{2x}[P_{0.2}O_{0.8}]_y$ may account for between 0.1 vol. % and 30 vol. %, between 1 vol. % and 20 vol. %, or between 3 vol. % and 15 vol. % of the active material, based on the total volume of the active material. It is believed that incorporation of water stable phosphates into alloy anode materials provides active anode materials having improved ionic conductivity which, as discussed above, results in alloy anodes having improved (lower) irreversible capacities as well as improved microstructure stability.

In some embodiments, the electrochemically active material may be represented by one or more of the following formulas: $Si_{75.6}Fe_{16.2}Mg_{4.9}[P_{0.2}O_{0.8}]_{3.3}$, $Si_{77}Fe_{17.8}Mg_{3.1}[P_{0.2}O_{0.8}]_{2.1}$, $Si_{78.3}Fe_{19.2}Mg_{1.5}[P_{0.2}O_{0.8}]_{1.0}$, $Si_{72.5}Fe_{19.8}Mg_{4.6}[P_{0.2}O_{0.8}]_{3.1}$, $Si_{73.9}Fe_{21.1}Mg_3[P_{0.2}O_{0.8}]_2$, $Si_{72.8}Sn_{2.6}Fe_{16.4}Mg_{4.9}[P_{0.2}O_{0.8}]_{3.3}$, $Si_{78}Fe_{20}[P_{0.2}O_{0.8}]_2$, $Si_{76.9}Fe_{16.5}Al_{3.3}[P_{0.2}O_{0.8}]_{3.3}$, $Si_{77.8}Fe_{18}Al_{2.1}[P_{0.2}O_{0.8}]_{2.1}$, or combinations thereof.

In some embodiments, the electrochemically active material may take the form of particles. The particles may have a diameter (or length of longest dimension) that is no greater than 60 μm, no greater than 40 μm, no greater than 20 μm, no greater than 10 μm, no greater than 7 μm, or even smaller; at least 0.5 μm, at least 1 μm, at least 2 μm, at least 5 μm, or at least 10 μm or even larger; or 0.5 to 10 μm, 1 to 10 μm, 2 to 10 μm, 40 to 60 μm, 1 to 40 μm, 2 to 40 μm, 10 to 40 μm, 5 to 20 μm, 10 to 20 μm, 1 to 30 μm, 1 to 20 μm, 1 to 10 μm, 0.5 to 30 μm, 0.5 to 20 μm, or 0.5 to 10 μm.

In some embodiments the electrochemically active material may take the form of particles having low surface area. The particles may have a surface area that is less than 20 $m^2/g$, less than 12 $m^2/g$, less than 10 $m^2/g$, less than 5 $m^2/g$, less than 4 $m^2/g$, or even less than 2 $m^2/g$.

In some embodiments, each of the phases of the electrochemically active material (i.e., the active phase, inactive phase, or any other phase of the active material) may include or be in the form of one or more grains. In some embodiments, the Scherrer grain size of each of the phases of the active material is no greater than 50 nanometers, no greater than 20 nanometers, no greater than 15 nanometers, no greater than 10 nanometers, or no greater than 5 nanometers. As used herein, the Scherrer grain size of a phase of an active material is determined, as is readily understood by those skilled in the art, by X-ray diffraction and the Scherrer equation.

In some embodiments, the phases can be distributed substantially homogeneously throughout the active material, including the surface and bulk of the material.

In some embodiments, the active material (e.g., in the form of particles) may bear on an exterior surface thereof a coating that at least partially surrounds the active material. By "at least partially surrounds" it is meant that there is a common boundary between the coating and the exterior of the active material. The coating can function as a chemically protective layer and can stabilize, physically and/or chemically, the components of the active material. Exemplary materials useful for coatings include amorphous carbon, graphitic carbon, LiPON glass, phosphates such as lithium phosphate ($Li_2PO_3$), lithium metaphosphate ($LiPO_3$), lithium dithionate ($LiS_2O_4$), lithium fluoride (LiF), lithium metasilicate ($LiSiO_3$), and lithium orthosilicate ($Li_2SiO_4$). The coating can be applied by milling, solution deposition, vapor phase processes, or other processes known to those of ordinary skill in the art.

In some embodiments, the present disclosure is further directed to negative electrode compositions for use in lithium ion batteries. The negative electrode compositions may include the above-described electrochemically active materials. Additionally, the negative electrode compositions may include one or more additives such as binders, conductive diluents, fillers, adhesion promoters, thickening agents for coating viscosity modification such as carboxymethylcellulose, polyacrylic acid, polyvinylidene fluoride, lithium polyacrylate, carbon black, or other additives known by those skilled in the art.

In illustrative embodiments, the negative electrode compositions may include an electrically conductive diluent to facilitate electron transfer from the composition to a current collector. Electrically conductive diluents include, for example, carbons, powdered metal, metal nitrides, metal carbides, metal silicides, and metal borides, or combinations thereof. Representative electrically conductive carbon diluents include carbon blacks such as Super P and Super S carbon blacks (both from Timcal, Switzerland), Shawinigan Black (Chevron Chemical Co., Houston, Tex.), acetylene black, furnace black, lamp black, graphite, carbon fibers, carbon nanotubes, and combinations thereof. In some embodiments, the amount of conductive diluent in the electrode composition may be at least 2 wt. %, at least 6 wt. %, or at least 8 wt. %, or at least 20 wt. % based upon the total weight of the electrode coating; less than 5 wt. less than 2 wt. %, or less than 1 wt. % based upon the total weight of the electrode composition, or between 0.2 wt. % and 80 wt. %, between 0.5 wt. % and 50 wt. %, between 0.5 wt. % and 20 wt. %, or between 1 wt. % and 10 wt. %, based upon the total weight of the electrode composition.

In some embodiments, the negative electrode compositions may include graphite to improve the density and cycling performance, especially in calendered coatings, as described in U.S. Patent Application Publication 2008/0206641 by Christensen et al., which is herein incorporated by reference in its entirety. The graphite may be present in the negative electrode composition in an amount of greater than 10 wt. %, greater than 20 wt. %, greater than 50 wt. %, greater than 70 wt. % or even greater, based upon the total weight of the negative electrode composition; or between 20 wt. % and 90 wt. %, between 30 wt. % and 80 wt. %, between 40 wt. % and 60 wt. %, between 45 wt. % and 55 wt. %, between 80 wt. % and 90 wt. %, or between 85 wt. % and 90 wt. %, based upon the total weight of the electrode composition.

In some embodiments, the negative electrode compositions may also include a binder. Suitable binders include oxo-acids and their salts, such as sodium carboxymethylcellulose, polyacrylic acid, lithium polyacrylate, sodium polyacrylate, methyl acrylate/acrylic acid copolymers, lithium methyl acrylate/acrylate copolymers, and other optionally lithium or sodium neutralized polyacrylic acid copolymers. Other suitable binders include polyolefins such as those prepared from ethylene, propylene, or butylene monomers; fluorinated polyolefins such as those prepared from vinylidene fluoride monomers; perfluorinated polyolefins such as those prepared from hexafluoropropylene monomer; perfluorinated poly(alkyl vinyl ethers); perfluorinated poly(alkoxy vinyl ethers); or combinations thereof. Other suitable binders include polyimides such as the aromatic, aliphatic or cycloaliphatic polyimides and polyacrylates. The binder may be crosslinked. In some embodiments, the amount of binder in the electrode composition may be at least 3 wt. %, at least 5 wt. %, at least 10 wt. %, or at least 20 wt. % based upon the total weight of the electrode coating; less than 30 wt. %, less than 20 wt. %, or less than 10 wt. %, based upon the total weight of the electrode composition; or between 3 wt. % and 30 wt. %, between 3 wt. % and 20 wt. %, or between 3 wt. % and 10 wt. %, based upon the total weight of the electrode composition.

In some embodiments, the present disclosure is further directed to negative electrodes for use in lithium ion electrochemical cells. The negative electrodes may include a current collector having disposed thereon the above-described negative electrode composition. The current collector may be formed of a conductive material such as a metal (e.g., copper, aluminum, nickel), or a carbon composite.

In some embodiments, the present disclosure further relates to lithium ion electrochemical cells. In addition to the above-described negative electrodes, the electrochemical cells may include a positive electrode, an electrolyte, and a separator. In the cell, the electrolyte may be in contact with both the positive electrode and the negative electrode, and the positive electrode and the negative electrode are not in physical contact with each other; typically, they are separated by a polymeric separator film sandwiched between the electrodes.

In some embodiments, the positive electrode may include a current collector having disposed thereon a positive electrode composition that includes a lithium transition metal oxide intercalation compound such as $LiCoO_2$, $LiCO_{0.2}Ni_{0.8}O_2$, $LiMn_2O_4$, $LiFePO_4$, $LiNiO_2$, or lithium mixed metal oxides of manganese, nickel, and cobalt in any proportion. Blends of these materials can also be used in positive electrode compositions. Other exemplary cathode materials are disclosed in U.S. Pat. No. 6,680,145 (Obrovac et al.) and include transition metal grains in combination with lithium-containing grains. Suitable transition metal grains include, for example, iron, cobalt, chromium, nickel, vanadium, manganese, copper, zinc, zirconium, molybdenum, niobium, or combinations thereof with a grain size no greater than about 50 nanometers.

In various embodiments, useful electrolyte compositions may be in the form of a liquid, solid, or gel. The electrolyte compositions may include a salt and a solvent (or charge-carrying medium). Examples of solid electrolyte solvents include polymers such as polyethylene oxide, polytetrafluoroethylene, fluorine-containing copolymers, and combinations thereof. Examples of liquid electrolyte solvents include ethylene carbonate (EC), diethyl carbonate (DEC), dimethyl carbonate (DMC), ethyl methyl carbonate (EMC), propylene carbonate, fluoroethylene carbonate (FEC), tetrahydrofuran (THF), acetonitrile, and combinations thereof. In some embodiments the electrolyte solvent may comprise glymes, including monoglyme, diglyme and higher glymes, such as tetraglyme Examples of suitable lithium electrolyte salts include $LiPF_6$, $LiBF_4$, $LiClO_4$, lithium bis(oxalato)borate, $LiN(CF_3SO_2)_2$, $LiN(C_2F_5SO_2)_2$, $LiAsF_6$, $LiC(CF_3SO_2)_3$, and combinations thereof.

In some embodiments, the lithium ion electrochemical cells may further include a microporous separator, such as a microporous material available from Celgard LLC, Charlotte, N.C. The separator may be incorporated into the cell and used to prevent the contact of the negative electrode directly with the positive electrode.

The disclosed lithium ion electrochemical cells can be used in a variety of devices including, without limitation, portable computers, tablet displays, personal digital assistants, mobile telephones, motorized devices (e.g., personal or household appliances and vehicles), instruments, illumination devices (e.g., flashlights) and heating devices. One or more lithium ion electrochemical cells of this disclosure can be combined to provide a battery pack.

The present disclosure further relates to methods of making the above-described electrochemically active materials. In some embodiments, the materials can be made by methods known to produce films, ribbons or particles of metals or alloys including cold rolling, arc melting, resistance heating, ball milling, sputtering, chemical vapor deposition, thermal evaporation, atomization, induction heating or melt spinning. The above described active materials may also be made via the reduction of metal oxides or sulfides.

The present disclosure further relates to methods of making negative electrodes that include the above-described negative electrode compositions. In some embodiments, the method may include mixing the above-described electrochemically active materials, along with any additives such as binders, conductive diluents, fillers, adhesion promoters, thickening agents for coating viscosity modification and other additives known by those skilled in the art, in a suitable coating solvent such as water or N-methylpyrrolidinone to form a coating dispersion or coating mixture. The dispersion may be mixed thoroughly and then applied to a foil current collector by any appropriate coating technique such as knife coating, notched bar coating, dip coating, spray coating, electrospray coating, or gravure coating. The current collectors may be thin foils of conductive metals such as, for example, copper, aluminum, stainless steel, or nickel foil. The slurry may be coated onto the current collector foil and then allowed to dry in air or vacuum, and optionally by drying in a heated oven, typically at about 80° to about 300° C. for about an hour to remove the solvent.

The present disclosure further relates to methods of making lithium ion electrochemical cells. In various embodiments, the method may include providing a negative electrode as described above, providing a positive electrode that includes lithium, and incorporating the negative electrode and the positive electrode into an electrochemical cell comprising a lithium-containing electrolyte.

Listing of Embodiments

1. An electrochemically active material represented by general formula (I):

$Si_uSn_vM_{1w}M_{2x}[P_{0.2}O_{0.8}]_y \cdot A_z$ (I)

where u, v, w, x, y, and z represent atomic % values and u+v+w+x+y+z=100;
$M_1$ comprises a metal element or combinations of metal elements selected from Ti, V, Cr, Mn, Fe, Co, Ni, Cu, Zr, B, carbon, or alloys thereof;
$M_2$ comprises a metal element or combinations of metal elements selected from Mg, Al, Ti, V, Cr, Mn, Fe, Co, Ni, Cu, Zn, Zr, or alloys thereof;
A is an inactive phase other than a phosphate or silicide; and
$0<u<90$, $0\leq v<20$, $0<w<50$, $0<x<20$, $0<y<20$, and $0\leq z<50$.
2. The electrochemically active material according to embodiment 1, wherein the electrochemically active material comprises an active phase that comprises one or more active elements selected from Mg, Ca, Sr, Ag, Zn, B, Al, Si, Sn, Pb, Sb, or Bi.
3. The electrochemically active material according to any one of embodiments 1-2, wherein the active phase comprise Si.
4. The electrochemically active material according to any one of embodiments 1-3, wherein the active phase comprise Sn.
5. The electrochemically active material according to embodiment 1, wherein the electrochemically active material comprises an active phase that consists essentially of Si.
6. The electrochemically active material according to any one of embodiments 1-5, wherein the active phase accounts for between 30 vol. % and 70 vol. % of the active material, based on the total volume of the active material.
7. The electrochemically active material according to any one of embodiments 1-6, wherein the electrochemically active material comprises an inactive phase comprising one or more electrochemically inactive chemical elements.
8. The electrochemically active material according to embodiment 7, wherein the inactive phase comprises titanium, vanadium, chromium, manganese, iron, cobalt, nickel, rare earth metals, or combinations thereof.
9. The electrochemically active material according to any one of embodiments 1-8, wherein the inactive phase accounts for between 30 vol. % and 70 vol. % of the active material, based on the total volume of the active material.
10. The electrochemically active material according to any one of embodiments 7-9, wherein the inactive phase comprises a conducting phase that accounts for between 1 vol. % and 60 vol. % of the active material, based on the total volume of the active material.
11. The electrochemically active material according to any one of embodiments 7-10, wherein the inactive phase comprises an insulating phase that accounts for between 0.1 vol. % and 30 vol. % of the active material, based on the total volume of the active material.
12. The electrochemically active material according to embodiment 11, wherein the insulating phase comprises a water stable phosphate.
13. The electrochemically active material according to embodiment 12, wherein the water stable phosphate comprises $Mg_3(PO_4)_2$, $FePO_4$, $Zn_3(PO_4)_2$, or $AlPO_4$.
14. The electrochemically active material according to any one of embodiments 1-13, wherein the phases of the electrochemically active material are distributed substantially homogeneously throughout the electrochemically active material.
15. The electrochemically active material according to any one of embodiments 1-14, wherein the Scherrer grain size of each phase of the electrochemically active material is 20 nanometers or less.
16. An electrode composition comprising:
the electrochemically active material according to any one of embodiments 1-15; and
a binder.
17. An electrode composition according to embodiment 16, further comprising graphite.
18. A negative electrode comprising:
the electrode composition according to any one of embodiments 16-17; and
a current collector.
19. An electrochemical cell comprising:
the negative electrode of embodiment 18;
a positive electrode comprising a positive electrode composition comprising lithium; and
an electrolyte comprising lithium.
20. An electronic device comprising the electrochemical cell according to embodiment 19.
21. A method of making an electrochemical cell, the method comprising:
providing a positive electrode comprising a positive electrode composition comprising lithium;
providing a negative electrode according to embodiment 18;
providing an electrolyte comprising lithium; and
incorporating the positive electrode, negative electrode, and the electrolyte into an electrochemical cell.

The operation of the present disclosure will be further described with regard to the following detailed examples. These examples are offered to further illustrate various specific embodiments and techniques. It should be understood, however, that many variations and modifications may be made while remaining within the scope of the present disclosure.

EXAMPLES

X-Ray Diffraction (XRD)

X-ray diffraction was used to identify the crystalline structure and grain size of the exemplary composites below. A Siemens D500 diffractometer equipped with a copper target X-ray tube and a diffracted beam monochromator was used for the diffraction measurements. The emitted X-rays utilized were the Cu $K_{\alpha 1}$ ($\lambda$=1.54051 Å) and Cu $K_{\alpha 2}$ ($\lambda$=1.54433 Å). The divergence and anti-scatter slits used were set both at 3°, while the receiving slit was set at 0.6°. The X-ray tube was powered to 45 kV at 40 mA.

Preparation of Composites

Example 1—Preparation of $Si_{75.6}Fe_{16.2}Mg_{4.9}[P_{0.2}O_{0.8}]_{3.3}$

Figure 1:
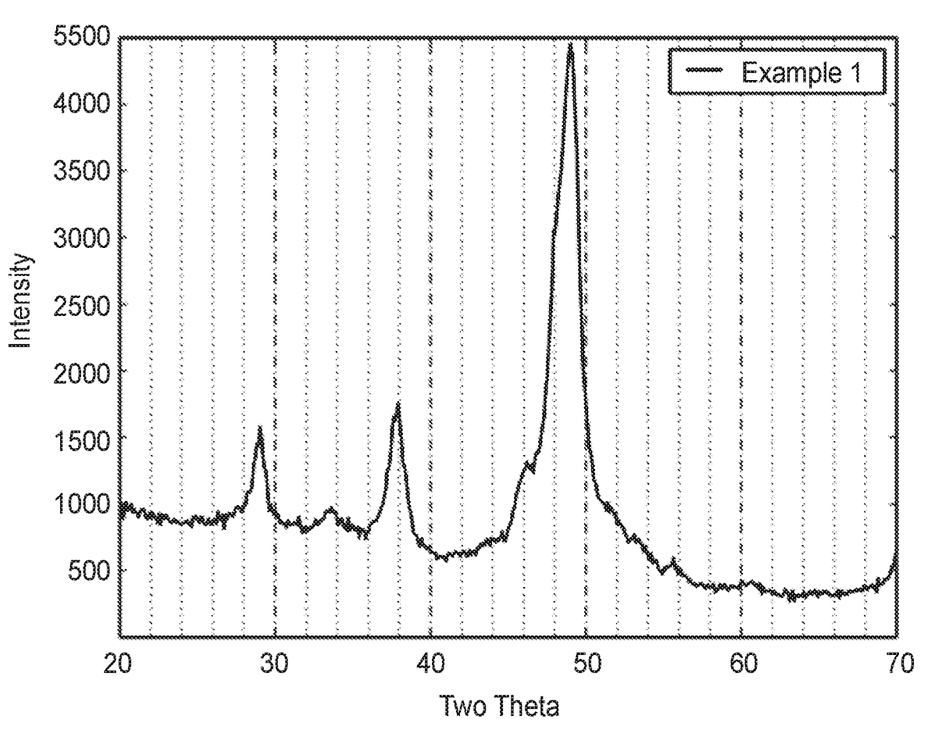
FIG. 1 shows an XRD pattern of the electrochemically active material of Example 1.

A $Si_{75.6}Fe_{16.2}Mg_{4.9}[P_{0.2}O_{0.8}]_{3.3}$ composite was prepared by roll milling. $Mg_3(PO_4)_2 \cdot xH_2O$ (available from Sigma Aldrich) was heated to 450° C. in air overnight to remove the crystallization water. Si powder (106.53 g available from Elkem Silicon Materials, Norway), iron (45.45 g available from North American Hoganas Inc., Hollsopple, Pa.) and $Mg_3(PO_4)_2$ (21.45 g prepared as described above) were charged into a 9 liter steel vessel with 20.88 kg of ½" steel balls. The vessel was purged with nitrogen gas for 15 minutes before it was sealed. The sealed vessel was then loaded onto a roller mill (available from U.S. Stoneware, East Palestine, Ohio) which rolled at 85 rpm speed for 9 days before the composite powder was discharged. An XRD pattern of the resulting composite powder in FIG. 1 showed peaks of both $\alpha$-$FeSi_2$ and $\beta$-$FeSi_2$. The Si (111) peak was not distinguishable as it was very close to $\beta$-$FeSi_2$ (202) diffraction. The Scherrer grain size of each phase was calculated using the Scherrer equation. The largest Scherrer grain size of the composite was listed in Table 1. Peaks for amorphous $Mg_3(PO_4)_2$ were too broad to be resolved. The volume ratio of the three phases $Si/FeSi_2/Mg_3(PO_4)_2$=50/35/15 as is listed in Table 1.

Example 2—Preparation of $Si_{72.8}Sn_{2.6}Fe_{16.4}Mg_{4.9}[P_{0.2}O_{0.8}]_{3.3}$ A $Si_{72.8}Sn_{2.6}Fe_{16.4}Mg_{4.9}[P_{0.2}O_{0.8}]_{3.3}$ composite was prepared by high energy ball milling. $Mg_3(PO_4)_2$ powder was prepared as described in Example 1. Si powder (1.9476 g), Sn powder (0.2924 g available from Reade Advanced Materials, Reno, Nev.), iron powder (0.8707 g available from North American Hoganas,) and 0.411 g of $Mg_3(PO_4)_2$ powder were charged in an 8009 Round-Ended Hardened Steel Vial (available from Spex CertiPrep, Metuchen, N.J.) with 117 g of 3/16" tungsten carbide balls. The vial was sealed in an argon filled glove box and milled for three hours in an 8000D Dual Mixer/Mill (available from Spex CertiPrep, Metuchen, N.J.). Powders were collected afterwards, and ground with an agate mortar and pestle. The volume ratio of three phases in the composite was listed in Table 1.

Example 3—Preparation of $Si_{77}Fe_{19.8}[P_{0.2}O_{0.8}]_{3.2}$

A $Si_{77}Fe_{19.8}[P_{0.2}O_{0.8}]_{3.2}$ composite was made using the ball milling method described in Example 2. The composite was prepared from Si powder, Fe powder and $FePO_4$ powder (available from Sigma Aldrich) in the volume ratios outlined in Table 1.

Example 4—Preparation of $Si_{75.7}Fe_{16.2}Zn_{4.9}[P_{0.2}O_{0.8}]_{3.2}$

A $Si_{75.7}Fe_{16.2}Zn_{4.9}[P_{0.2}O_{0.8}]_{3.2}$ composite was prepared using the roller milling method described in Example 1. The composite was prepared from Si powder, Fe powder and $Zn_3(PO_4)_2$ powder (available from Sigma Aldrich) in the volume ratios outlined in Table 1.

Examples 5 and 6—Preparation of $Si_{77.8}Fe_{18}Al_{2.1}[P_{0.2}O_{0.8}]_{2.1}$, $Si_{76.9}Fe_{16.5}Al_{3.3}[P_{0.2}O_{0.8}]_{3.3}$ $Si_{77.8}Fe_{18}Al_{2.1}[P_{0.2}O_{0.8}]_{2.1}$ and $Si_{76.9}Fe_{16.5}Al_{3.3}[P_{0.2}O_{0.8}]_{3.3}$ were prepared using the roller milling method described in Example 1. The composites were prepared from Si powder, Fe powder and $AlPO_4$ powder (available from Sigma Aldrich) in the volume ratios outlined in Table 1.

Examples 7, 8 and 9—Preparation of $Si_{77.8}Fe_{18}Al_{2.1}[P_{0.2}O_{0.8}]_{2.1}$, $Si_{74.6}Fe_{13}Al_{6.2}[P_{0.2}O_{0.8}]_{6.2}$, $Si_{73.5}Fe_{20.1}Al_{3.2}[P_{0.2}O_{0.8}]_{3.2}$ $Si_{77.8}Fe_{18}Al_{2.1}[P_{0.2}O_{0.8}]_{2.1}$, $Si_{74.6}Fe_{13}Al_{6.2}[P_{0.2}O_{0.8}]_{6.2}$, $Si_{73.5}Fe_{20.1}Al_{3.2}[P_{0.2}O_{0.8}]_{3.2}$ composites were prepared using the ball milling method described in Example 2. The composites were prepared from Si powder, Fe powder and $AlPO_4$ powder in the volume ratios outlined in Table 1.

Example 10—Preparation of $Si_{74.6}Fe_{21.4}Al_2[P_{0.2}O_{0.8}]_2$

A $Si_{74.6}Fe_{21.4}Al_2[P_{0.2}O_{0.8}]_2$ composite was prepared by roll milling. Si (4139.15 g), Fe (2358.44 g) and $AlPO_4$ (486.51 g) were charged into an 85 gallon steel vessel with 759 kg of ½" steel balls. The vessel was purged with nitrogen gas for 20 minutes before it was sealed. The sealed vessel was rolled at 47 rpm speed for 60 hours before the composite powder was discharged. The volume ratio of the three phases $Si/FeSi_2/AlPO_4$=40/50/10 as is listed in Table 1.

Comparative Example 1—Preparation of $Si_{75.8}Fe_{16.3}Ca_{4.7}[P_{0.2}O_{0.8}]_{3.2}$ A $Si_{75.8}Fe_{16.3}Ca_{4.7}[P_{0.2}O_{0.8}]_{3.2}$ composite was prepared using the roller milling method described in Example 1. The composites were prepared from Si powder, Fe powder and $Ca_3(PO_4)_2$ powder (available from Sigma Aldrich) in the volume ratios outlined in Table 1.

Comparative Examples 2 and 3—Preparation of $Si_{66.4}Al_{16.8}[P_{0.2}O_{0.8}]_{16.8}$, $Si_{56.8}Al_{21.6}[P_{0.2}O_{0.8}]_{21.6}$ $Si_{66.4}Al_{16.8}[P_{0.2}O_{0.8}]_{16.8}$ and $Si_{56.8}Al_{21.6}[P_{0.2}O_{0.8}]_{21.6}$ were prepared using the roller milling method described in Example 1. The composites were prepared from Si powder and $AlPO_4$ powder in the volume ratios outlined in Table 1.

TABLE 1

| Examples | Electrochemically Active Phase (1) | Conducting Phase (2) | Insulating Phase (3) | Volume Percent (1) | Volume Percent (2) | Volume Percent (3) | Largest Scherrer Grain Size (nm) |
|---|---|---|---|---|---|---|---|
| Example 1 | Si | FeSi2 | Mg3(PO4)2 | 50 | 35 | 15 | 11.7 |
| Example 2 | Si/Sn | FeSi2 | Mg3(PO4)2 | 46/4 | 35 | 15 | 16.6 |
| Example 3 | Si | FeSi2 | FePO4 | 50 | 35 | 15 | 12 |
| Example 4 | Si | FeSi2 | Zn3(PO4)2 | 50 | 35 | 15 | 11.5 |
| Example 5 | Si | FeSi2 | AlPO4 | 50 | 40 | 10 | 13 |
| Example 6 | Si | FeSi2 | AlPO4 | 50 | 35 | 15 | 9.5 |
| Example 7 | Si | FeSi2 | AlPO4 | 50 | 40 | 10 | 12.8 |
| Example 8 | Si | FeSi2 | AlPO4 | 50 | 25 | 25 | 11.9 |
| Example 9 | Si | FeSi2 | AlPO4 | 40 | 45 | 15 | 10.9 |
| Example 10 | Si | FeSi2 | AlPO4 | 40 | 50 | 10 | 9.1 |
| Comparative Example 1 | Si | FeSi2 | Ca3(PO4)2 | 50 | 35 | 15 | 9.6 |
| Comparative Example 2 | Si | FeSi2 | AlPO4 | 50 | 0 | 50 | 15.4 |
| Comparative Example 3 | Si | FeSi2 | AlPO4 | 40 | 0 | 60 | 15.7 |

Preparation of Electrochemical Cells

A binder solution was prepared as follows: 35 wt % aqueous solution of polyacrylic acid (PAA) (250K MW, available from Sigma Aldrich), de-ionized water, and lithium hydroxide monohydrate (available from Sigma Aldrich) were mixed in a 1.00:2.48:0.20 weight ratio, and placed in a shaker for 5 hours. The resulting solution was a 10 wt % lithium polyacrylate (LiPAA) aqueous binder solution.

Electrodes comprising the composite particles and lithium polyacrylate (LiPAA) with a 91/9 weight ratio were made by placing 1.82 g of the composite particles, 1.80 g of a 10% LiPAA aqueous solution prepared above in a 45-milliliter tungsten carbide vessel with four tungsten carbide balls (12.75 mm diameter) and mixing in a planetary micro mill (PULVERISETTE 7, available from Fritsch GmbH, Idon-Oberstein, Germany) at a speed setting of two for one hour. The resulting slurry was then coated onto a copper foil using a coating bar with a 0.003" gap and dried under vacuum at 120° C. for two hours. Coin cell electrodes were then punched from this foil.

Electrochemical 2325 coin cells were made with the composite particle electrodes versus a lithium foil counter/reference electrode. The electrolyte contained 10 wt % FEC and 90 wt % Selectilyte LP 57 (1M LiPF6 in EC:EMC 30:70 w/w solution, available from BASF, Independence, Ohio). Two pieces of Celgard 2320 microporous membranes (available from Celgard LLC, Charlotte, N.C.) served as the separator.

Electrochemical Cell Testing

The coin cells were then cycled at room temperature using a Maccor 4000 Series charger (available from Maccor Inc, Tulsa, Okla.). The first cycle was performed at C/10 with a C/40 trickle at 5 mV and a delithiation up to 1.5V, subsequent cycles were performed at C/4 with a C/20 trickle at 5 mV and a delithiation up to 0.9 V. In Table 2 the initial lithiation capacities, $2^{nd}$ delithiation capacities and the delithiation capacities of the cells after 50 cycles are listed. Table 3 was used to compare the first cycle efficiencies of the cells with different volume ratio of FeSi$_2$ and AlPO$_4$ containing 50 vol % and 40 vol % active Si respectively.

TABLE 2

Cycling Capacities

| Examples | First lithiation capacity (mAh/g) | Second delithiation capacity (mAh/g) | Delithiation capacity at cycle 50 (mAh/g) |
|---|---|---|---|
| Example 1 | 1194 | 938 | 960 |
| Example 2 | 1025 | 831 | 891 |
| Example 3 | 941 | 711 | 748 |
| Example 4 | 1310 | 1006 | 910 |
| Example 5 | 1354 | 1154 | 992 |
| Example 6 | 1354 | 1052 | 1056 |
| Example 7 | 1043 | 951 | 925 |
| Example 8 | 1273 | 1098 | 843 |
| Example 9 | 824 | 703 | 640 |
| Example 10 | 868 | 635 | |
| Comparative Example 1 | 826 | 71 | 30 |
| Comparative Example 2 | 1680 | 466 | 574 |
| Comparative Example 3 | 1536 | 274 | 281 |

TABLE 3

First Cycle Efficiencies

| Examples | Si/FeSi2/AlPO4 Volume Ratio | First Cycle Efficiency |
|---|---|---|
| Example 5 | 50/40/10 | 94-95% |
| Example 7 | 50/40/10 | 89-90% |
| Example 6 | 50/35/15 | 89-91% |
| Example 8 | 50/25/25 | 86-87% |
| Comparative Example 2 | 50/0/50 | 40% |
| Example 10 | 40/50/10 | 86-87% |
| Example 9 | 40/45/15 | 85-87% |
| Comparative Example 3 | 40/0/60 | 30% |

What is claimed:

1. An electrochemically active material represented by general formula (I):

$$Si_u Sn_v M_{1w} M_{2x}[P_{0.2}O_{0.8}]_y \cdot A_z \qquad (I)$$

where u, v, w, x, y, and z represent atomic % values and u+v+w+x+y+z=100;

$M_1$ comprises a metal element or combinations of metal elements selected from Ti, V, Cr, Mn, Fe, Co, Ni, Cu, Zr, B, carbon, or alloys thereof;

$M_2$ comprises a metal element or combinations of metal elements selected from Mg, Al, Ti, V, Cr, Mn, Fe, Co, Ni, Cu, Zn, Zr, or alloys thereof;

A is an inactive phase other than a phosphate or silicide; and $0<u<90$, $0\leq v<20$, $0<w<50$, $0<x<20$, $0<y<20$, and $0\leq z<50$;

wherein the electrochemically active material includes one or more active phases and an insulating phase, wherein the insulating phase includes the moiety $M_{2x}[P_{0.2}O_{0.8}]_y$ of formula (I), and wherein each of the one or more active phases and the insulating phase of the electrochemically active material includes or is in the form of one or more grains, wherein the electrochemically active material comprises an active phase that comprises one or more active elements selected from Mg, Ca, Sr, Ag, Zn, B, Al, Si, Sn, Pb, Sb, or Bi, the active phase accounting for between 30 vol. % and 70 vol. % of the electrochemically active material, based on the total volume of the electrochemically active material, wherein the inactive phase comprises titanium, vanadium, chromium, manganese, iron, cobalt, nickel, rare earth metals, or combinations thereof, and wherein the inactive phase comprises a conducting phase that accounts for between 1 vol. % and 60 vol. % of the electrochemically active material, based on the total volume of the electrochemically active material.

2. The electrochemically active material according to claim 1, wherein the active phase comprises Si.

3. The electrochemically active material according to claim 1, wherein the active phase comprises Sn.

4. The electrochemically active material according to claim 1, wherein the electrochemically active material comprises an active phase that consists essentially of Si.

5. The electrochemically active material according to claim 1, wherein the inactive phase accounts for between 30 vol. % and 70 vol. % of the electrochemically active material, based on the total volume of the electrochemically active material.

6. The electrochemically active material according to claim 1, wherein the inactive phase comprises an insulating phase that accounts for between 0.1 vol. % and 30 vol. % of the electrochemically active material, based on the total volume of the electrochemically active material.

7. The electrochemically active material according to claim 6, wherein the insulating phase comprises a water stable phosphate.

8. The electrochemically active material according to claim 7, wherein the water stable phosphate comprises $Mg_3(PO_4)_2$, $FePO_4$, $Zn_3(PO_4)_2$, or $AlPO_4$.

9. The electrochemically active material according to claim 1, wherein the phases of the electrochemically active material are distributed substantially homogeneously throughout the electrochemically active material.

10. The electrochemically active material according to claim 1, wherein the Scherrer grain size of each phase of the electrochemically active material is 20 nanometers or less.

11. An electrode composition comprising:
   the electrochemically active material according to claim 1; and
   a binder.

12. An electrode composition according to claim 11, further comprising graphite.

13. A negative electrode comprising:
   the electrode composition according to claim 11; and
   a current collector.

14. An electrochemical cell comprising:
   the negative electrode of claim 13;
   a positive electrode comprising a positive electrode composition comprising lithium; and
   an electrolyte comprising lithium.

15. A method of making an electrochemical cell, the method comprising:
   providing a positive electrode comprising a positive electrode composition comprising lithium;
   providing a negative electrode according to claim 13;
   providing an electrolyte comprising lithium; and
   incorporating the positive electrode, negative electrode, and the electrolyte into an electrochemical cell.

* * * * *